(12) United States Patent
Lin (10) Patent No.: US 8,722,541 B2
(45) Date of Patent: May 13, 2014

(54) DOUBLE PATTERNING METHOD FOR SEMICONDUCTOR DEVICES

(75) Inventor: Chih-Han Lin, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 105 days.

(21) Appl. No.: 13/421,606

(22) Filed: Mar. 15, 2012

(65) Prior Publication Data

US 2013/0244430 A1    Sep. 19, 2013

(51) Int. Cl.
*H01L 21/302* (2006.01)
(52) U.S. Cl.
USPC ........... 438/692; 438/689; 438/706; 438/704; 438/738; 430/30; 430/312; 430/317
(58) Field of Classification Search
USPC ................. 438/689–692, 706, 711, 704, 738; 430/30, 312–317
See application file for complete search history.

(56) References Cited

U.S. PATENT DOCUMENTS

| | | | |
|---|---|---|---|
| 6,867,116 B1 * | 3/2005 | Chung ................ | 438/551 |
| 2004/0137672 A1 * | 7/2004 | Lee et al. ................ | 438/183 |
| 2009/0197387 A1 * | 8/2009 | Wong et al. ................ | 438/400 |
| 2010/0173498 A1 * | 7/2010 | Abatchev et al. ................ | 438/704 |

* cited by examiner

*Primary Examiner* — Nadine Norton
*Assistant Examiner* — Maki Angadi
(74) *Attorney, Agent, or Firm* — Haynes and Boone, LLP (57) ABSTRACT

A method of fabricating a semiconductor device is disclosed. The exemplary method includes providing a substrate including a device layer and a sacrificial layer formed over the device layer and patterning the sacrificial layer thereby defining a cut pattern. The cut pattern of the sacrificial layer having an initial width. The method further includes depositing a mask layer over the device layer and over the cut pattern of the sacrificial layer. The method further includes patterning the mask layer thereby defining a line pattern including first and second portions separated by the cut pattern of the sacrificial layer and selectively removing the cut pattern of the sacrificial layer thereby forming a gap that separates the first and second portions of the line pattern of the mask layer. The method further includes patterning the device layer using the first and second portions of the line pattern of the mask layer.

20 Claims, 11 Drawing Sheets

DOUBLE PATTERNING METHOD FOR SEMICONDUCTOR DEVICES

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as field-effect transistors (FETs), are scaled down through various technology nodes, controlling end-to-end critical dimensions and profile control of the scaled down devices is becoming more difficult. Accordingly, although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

With reference to FIGS. 1 and 2 to 11, a method 100 and a semiconductor device 200 are collectively described below. The semiconductor device 200 illustrates an integrated circuit, or portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by MOS technology processing, and thus some processes are not described in detail herein. It is further understood that additional features can be added in the semiconductor device 200, and some of the features described below can be replaced or eliminated, for additional embodiments of the semiconductor device 200. The following disclosure will continue with a MOSFET example of a semiconductor device 200, to illustrate various embodiments of the present disclosure. It is understood, however, that the disclosure should not be limited to a particular type of device, except as specifically claimed.

Figure 1:
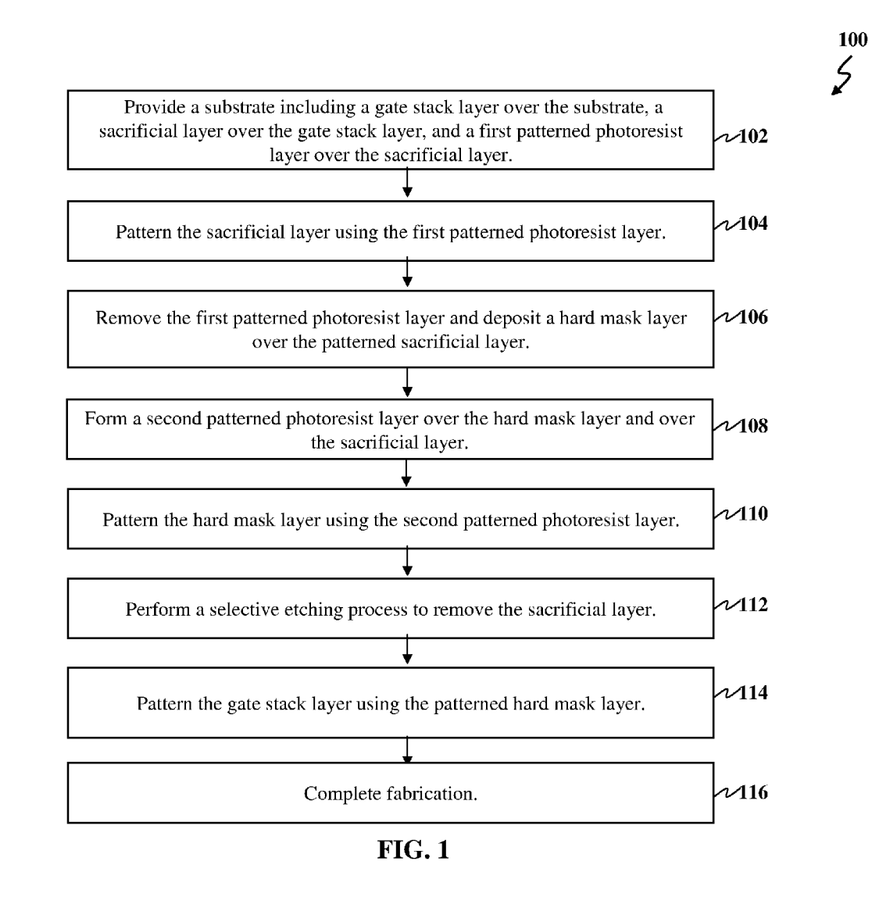
FIG. 1 is a flowchart illustrating a method of forming a semiconductor device according to various aspects of the present disclosure.

Referring to FIG. 1, a method 100 for fabricating a semiconductor device is described according to various aspects of the present disclosure. The method 100 begins with step 102 in which a substrate is provided. The substrate includes a gate stack layer formed over the substrate, a sacrificial dielectric layer formed over the gate stack layer, and a first patterned photoresist layer formed over the sacrificial layer. The method 100 continues with step 104 in which the sacrificial layer is patterned using the first patterned photoresist layer. The patterning may a dry or a wet etching process. The method continues at step 106 in which the first patterned photoresist layer is removed and a hard mask layer is deposited over the patterned sacrificial layer. After the removal of the first patterned photoresist layer, an etching process may be preformed to trim the critical dimensions of the sacrificial layer. The hard mask layer may be deposited such that a top surface of the sacrificial layer is uncovered. Alternatively, the hard mask layer may be deposited such that it substantially covers the sacrificial layer and after which a chemical mechanical polishing (CMP) process is performed to uncover a top surface of the sacrificial layer. The method 100 continues at step 108 in which a second patterned photoresist layer is formed over the hard mask layer and the uncovered top surface of the sacrificial layer. The method 100 continues at step 110 in which the hard mask layer is patterned using the second patterned photoresist layer. The method continues at step 112 in which a selective etching process is performed to remove the sacrificial layer, thereby forming a separation between end portions of the patterned hard mask layer. The method 100 continues at step 114 in which the gate stack layer is patterned using the patterned hard mask layer. The method 100 continues at step 116 in which fabrication is completed. Additional steps can be provided before, during, and after the method 100, and some of the steps described below can be replaced or eliminated, for additional embodiments of the method. The discussion that follows illustrates various embodiments of a semiconductor device 200 that can be fabricated according to the method 100 of FIG. 1.

FIGS. 2 to 11 illustrate perspective views of one embodiment of a semiconductor device 200 at various stages of fabrication according to the method 100 of FIG. 1. It is understood that the semiconductor device 200 may include various other devices and features, such as other types of transistors such as bipolar junction transistors, resistors, capacitors, diodes, fuses, etc. Accordingly, FIGS. 2-11 have been simplified for the sake of clarity to better understand the concepts of the present disclosure. Additional features can be added in the semiconductor device 200, and some of the features described below can be replaced or eliminated in other embodiments of the semiconductor device 200.

Figure 2:
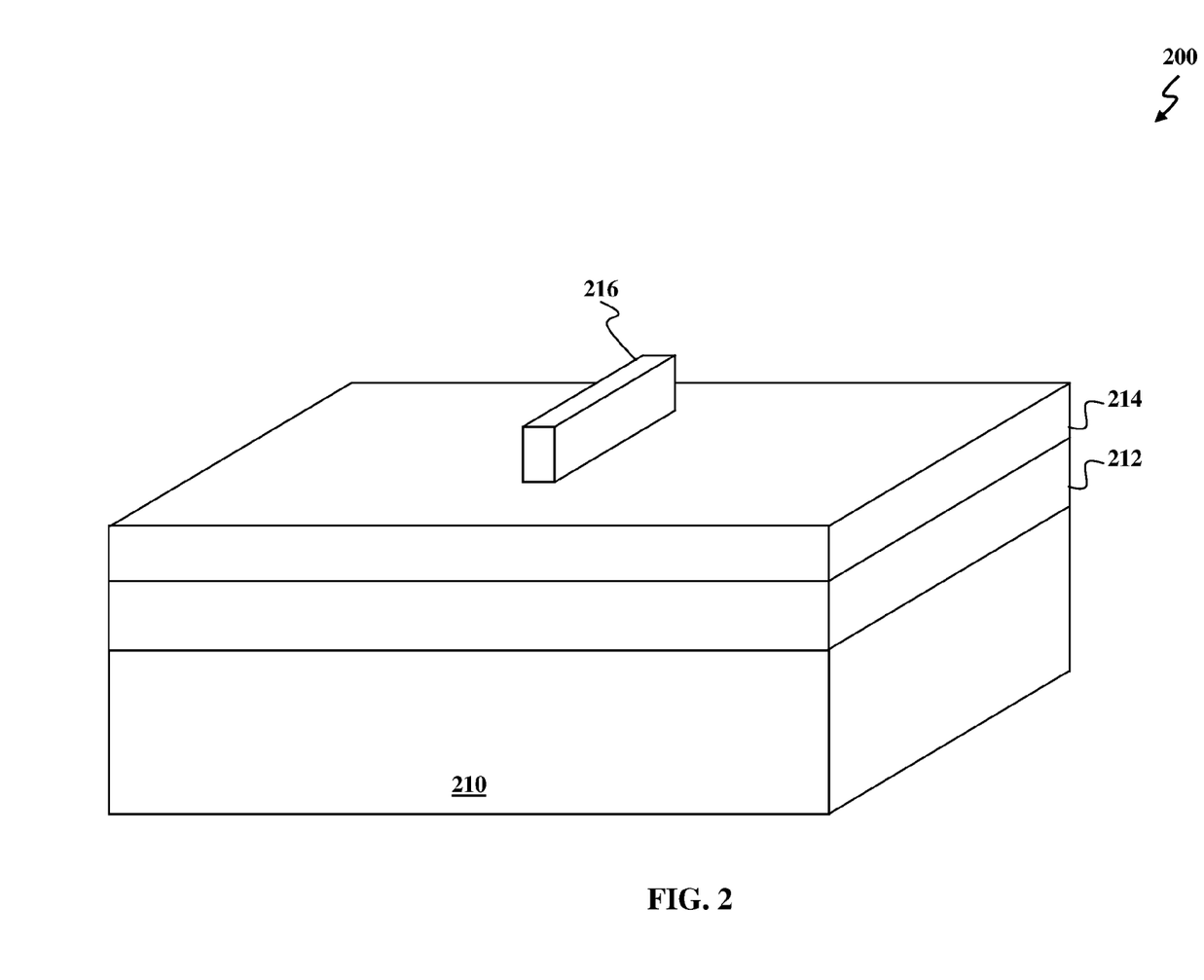
FIGS. 2 to 11 illustrate diagrammatic perspective views of one embodiment of a semiconductor device at various stages of fabrication according to the method of FIG. 1.

Referring to FIG. 2, the semiconductor device 200 includes a substrate 210. The substrate 210 may include an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. The substrate 210 may be an ultra-thin-body (UTB) semiconductor on insulator (SOI) substrate including silicon (Si). A UTB substrate, for example, may have a thickness (of the semiconductor material) from about 10 to about 30 nanometers. The SOI substrate can be fabricated using separation by implantation of oxygen (SIMOX), wafer bonding, and/or other suitable methods.

The substrate 210 includes various doped regions depending on design requirements, (e.g., p-type wells or n-type wells). The doped regions are doped with p-type dopants, such as boron or BF2, and/or n-type dopants, such as phosphorus or arsenic. The doped regions may be formed directly on the substrate 210, in a P-well structure, in an N-well structure, in a dual-well structure, or using a raised structure. The doped regions include various active regions, such as regions configured for an N-type metal-oxide-semiconductor transistor (referred to as an NMOS) and regions configured for a P-type metal-oxide-semiconductor transistor (referred to as a PMOS).

The substrate 210 can include an isolation region to define and isolate various active regions of the substrate 210. The isolation region utilizes isolation technology, such as shallow trench isolation (STI) or local oxidation of silicon (LOCOS), to define and electrically isolate the various regions. The isolation region includes silicon oxide, silicon nitride, silicon oxynitride, other suitable materials, or combinations thereof.

With further reference to FIG. 2, the substrate 210 includes a gate stack layer 212 is formed over the substrate 210 to a suitable thickness. The gate stack layer 212 may include one or more layers. For example, the gate stack layer 212 may include an insulation layer and gate electrode. For example, the insulation layer may include a material such as silicon oxide, high-k dielectric material, other suitable dielectric material, or combinations thereof. Examples of high-k dielectric material include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate stack layer 212 may include numerous other layers, for example, capping layers, interface layers, diffusion layers, barrier layers, or combinations thereof. The gate stack layer 212 is formed by chemical vapor deposition (CVD), physical vapor deposition (PVD), atomic layer deposition (ALD), high density plasma CVD (HDPCVD), plating, other suitable methods, and/or combinations thereof.

Still referring to FIG. 2, the substrate 210 further includes a sacrificial layer 214. The sacrificial layer 214 may be a dielectric material such as silicon oxide, silicon nitride, or other suitable materials. Alternatively, the sacrificial layer 214 may be any suitable material. In the present embodiment, the sacrificial layer 214 is silicon oxide. The sacrificial layer 214 may be formed by chemical vapor deposition (CVD), physical vapor deposition (PVD), atomic layer deposition (ALD), high density plasma CVD (HDPCVD), plating, other suitable methods, and/or combinations thereof.

Still referring to FIG. 2, a first photoresist layer 216 is formed and patterned over the sacrificial layer 214. Patterning the first photoresist layer 216 includes exposing the first photoresist layer 216 to a pattern, performing a post-exposure bake process, and developing the first photoresist layer 216 thereby forming a patterned first photoresist layer 216. The patterning may also be implemented or replaced by other proper methods, such as maskless photolithography, electron-beam writing, ion-beam writing, and molecular imprint.

Figure 3:
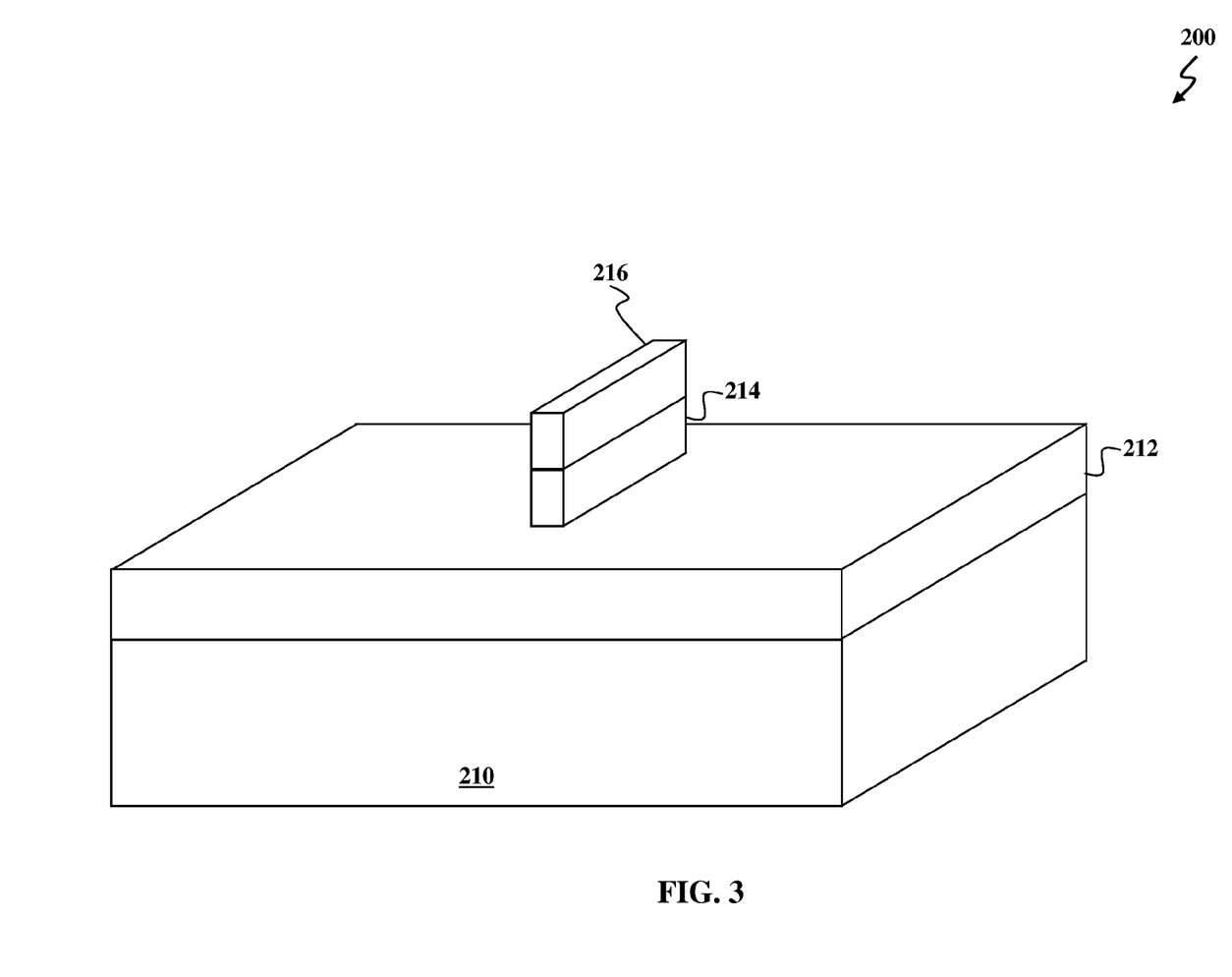

Referring to FIG. 3, an etching process is performed on the sacrificial layer 214 using the patterned first photoresist layer 216 to define a cut pattern. The etching process may be a single or a multiple step etching process. Further, the etching process may include wet etching, dry etching, or a combination thereof. In one example, a dry etching process is used to etch the sacrificial layer 214 that includes a chemistry including fluorine-containing gas. In furtherance of the example, the chemistry of the dry etch includes CF4, SF6, or NF3. In another example, a wet etching process is used to etch the sacrificial layer 214 that includes diluted hydrogen fluoride. Alternatively, the etching process may be any suitable etching process.

Figure 4:
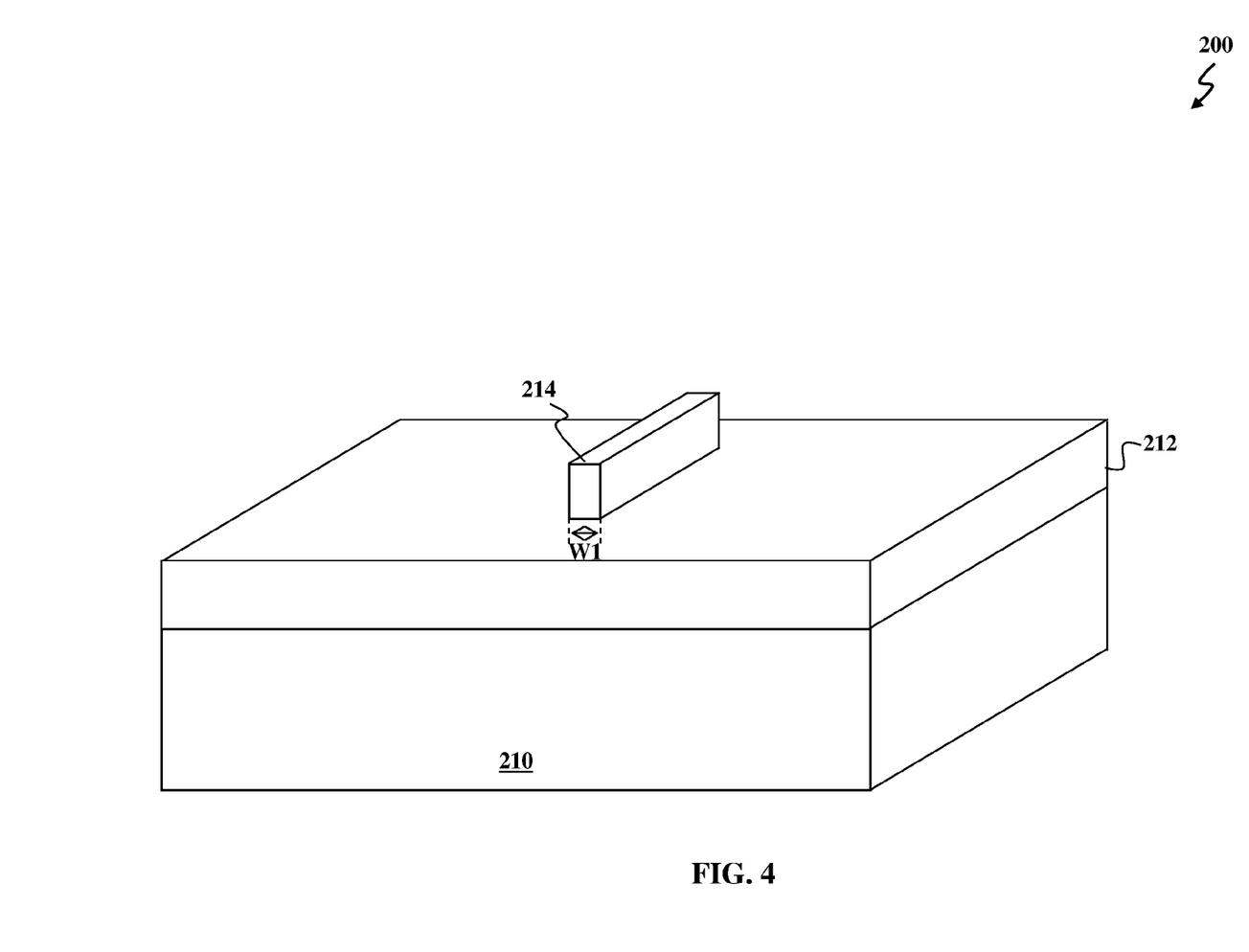

Referring to FIG. 4, after the etching process, the first photoresist layer 214 may be removed by any suitable process. For example, the first photoresist layer 214 may be removed by a liquid "resist stripper", which chemically alters the resist so that it no longer adheres to the underlying hardmask. Alternatively, first photoresist layer 214 may be removed by a plasma containing oxygen, which oxidizes it. As illustrated, the patterned sacrificial layer 214 has an initial width (W1). The initial width W1 may range from about 40 nm to about 12 nm. In the present embodiment, the initial width W1 is about 30 nm.

Figure 5:
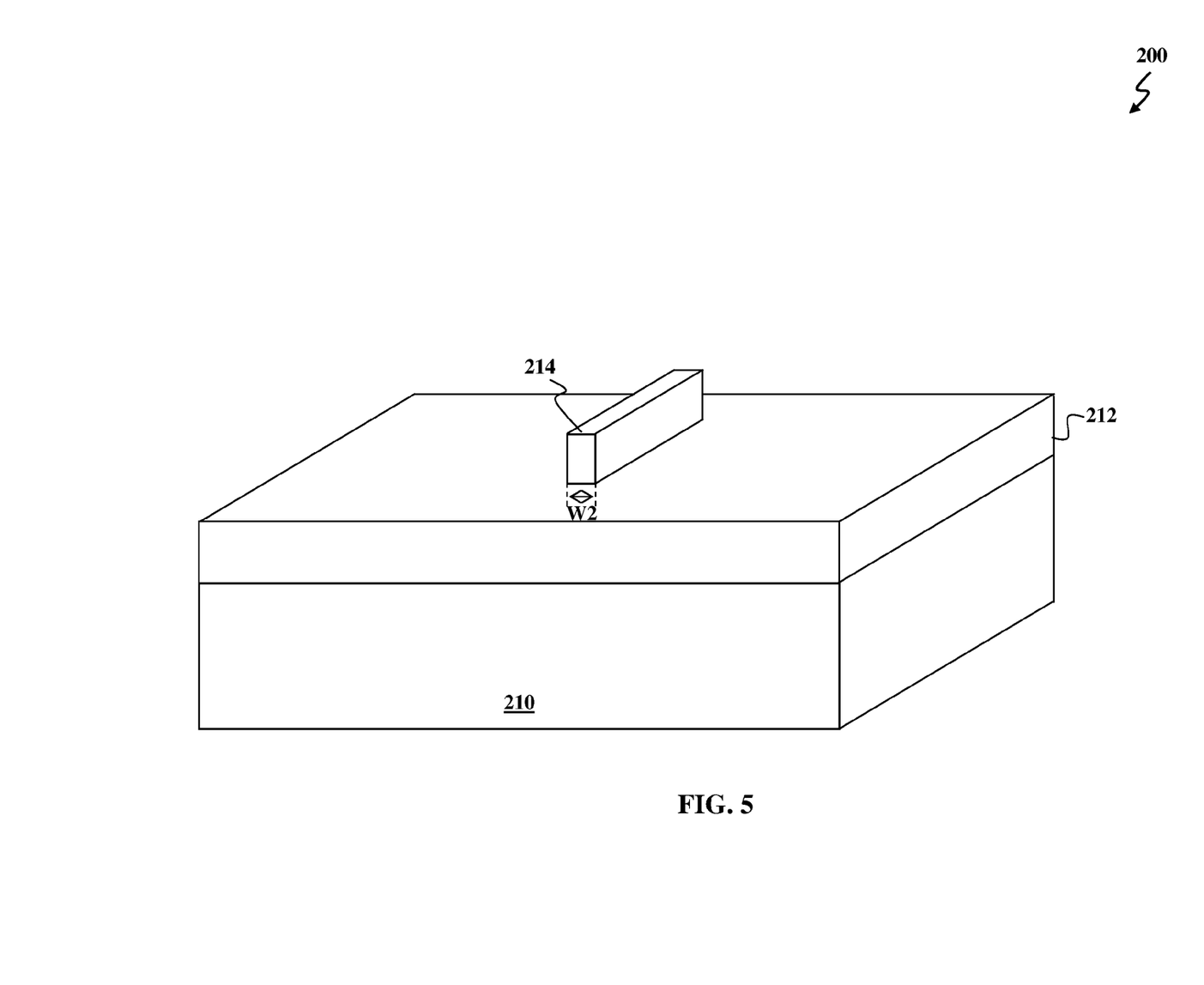

Referring to FIG. 5, a critical dimension (CD) trim process is performed to trim the W1 dimension to a smaller W2 dimension. The CD trim process may be a wet etching process or a dry etching process. In the present embodiment, the CD trim process is a wet etching process that includes diluted hydrogen fluoride. In an alternative process, the CD trim process is a dry etching process that includes a fluorine-containing gas.

After the CD trim process, the initial width W1 is trimmed down to a final width W2, which is smaller then the initial width W1. The final width W2 may range from about 40 nm to about 10 nm. It is understood that the CD trim process may be preformed such that the width W2 is any desirable width. For example, in the present embodiment, the final width W2 is about 22 nm. As will be further discussed below, the current process allows for final semiconductor device 200 with a higher device density for a fixed area.

Figure 6:
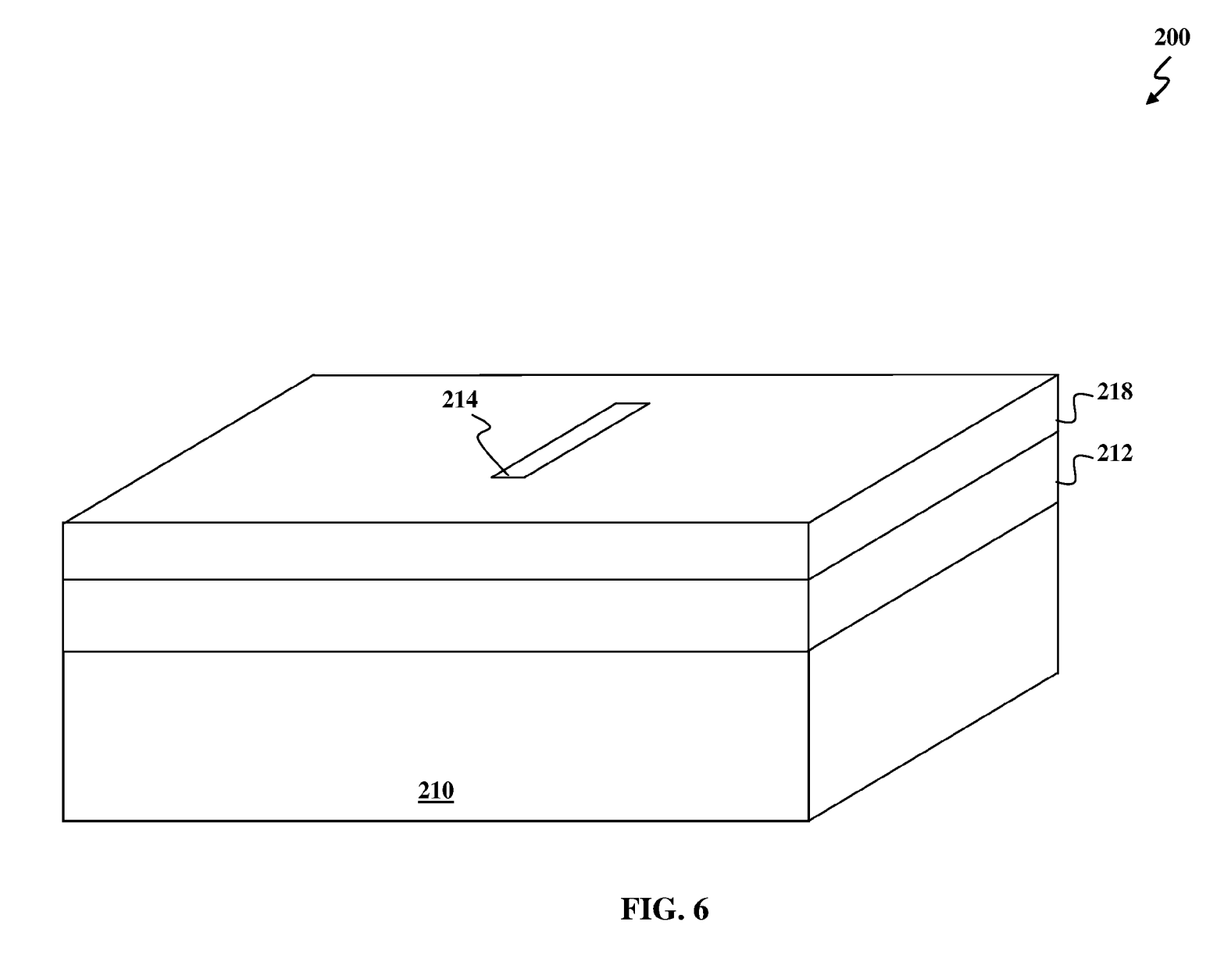

Referring to FIG. 6, a hard mask layer 218 is deposited over the gate stack layer 212 and the sacrificial layer 214. The hard mask layer 218 may be may be a dielectric material such as silicon oxide, silicon nitride, or other suitable materials. In the present embodiment, the hard mask layer 218 is silicon nitride. The hard mask layer 218 may be formed by chemical vapor deposition (CVD), physical vapor deposition (PVD), atomic layer deposition (ALD), high density plasma CVD (HDPCVD), plating, other suitable methods, and/or combinations thereof. Notably, for further processing, the material of the sacrificial layer 214 and the hard mask layer 218 can have different etching selectivity. Accordingly, in the present embodiment, the sacrificial layer 214 is silicon oxide and the hard mask layer 218 is silicon nitride. It is understood that in other embodiments, the sacrificial layer 214 and the hard mask layer 218 may include different materials.

Figure 7:
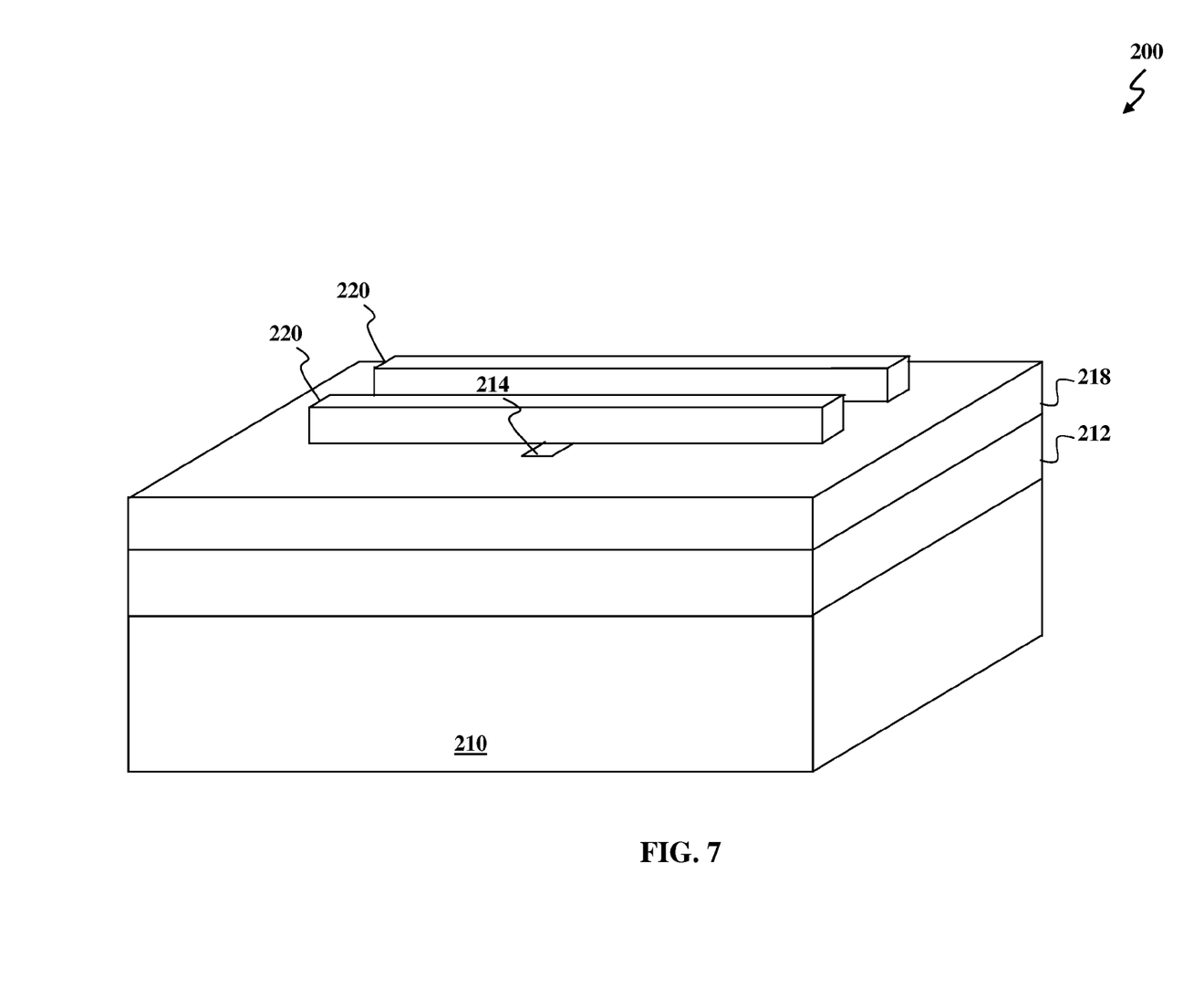

Referring to FIG. 7, a second photoresist layer 220 is formed and patterned over the sacrificial layer 214 and over the hard mask layer 218. Patterning the second photoresist layer 220 includes exposing the second photoresist layer 220 to a pattern, performing a post-exposure bake process, and developing the second photoresist layer 220 thereby forming a patterned second photoresist layer 220. The patterning may also be implemented or replaced by other proper methods, such as maskless photolithography, electron-beam writing, ion-beam writing, and molecular imprint. In the preset embodiment, the second photoresist layer 220 defines gate structures of multiple FET devices.

Figure 8:
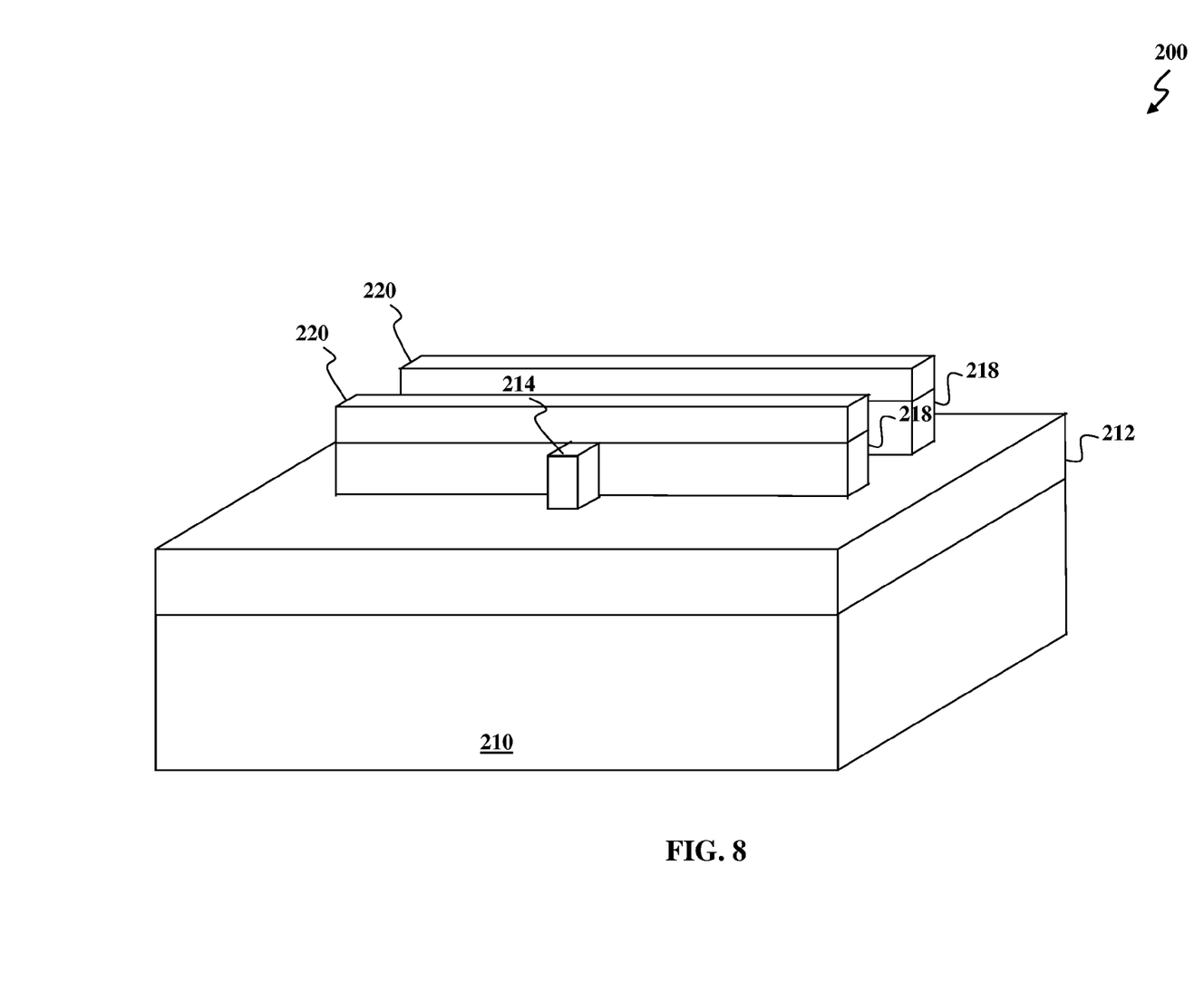

Referring to FIG. 8, an etching process is performed on the hard mask layer 218 using the patterned second photoresist layer 220 to define a line pattern. In the present embodiment, the line pattern defines a plurality of gate stack patterns of the patterned hard mask layer. The etching process may be a single or a multiple step etching process. Further, the etching process may include wet etching, dry etching, or a combination thereof. In one example, a dry etching process is used to etch the mask layer 218 that includes a chemistry including fluorine-containing gas. In furtherance of the example, the chemistry of the dry etch includes CF4, SF6, or NF3. In another example, a wet etching process is used to etch the mask layer 218 that includes phosphoric acid. Alternatively, the etching process may be any suitable etching process.

Figure 9:
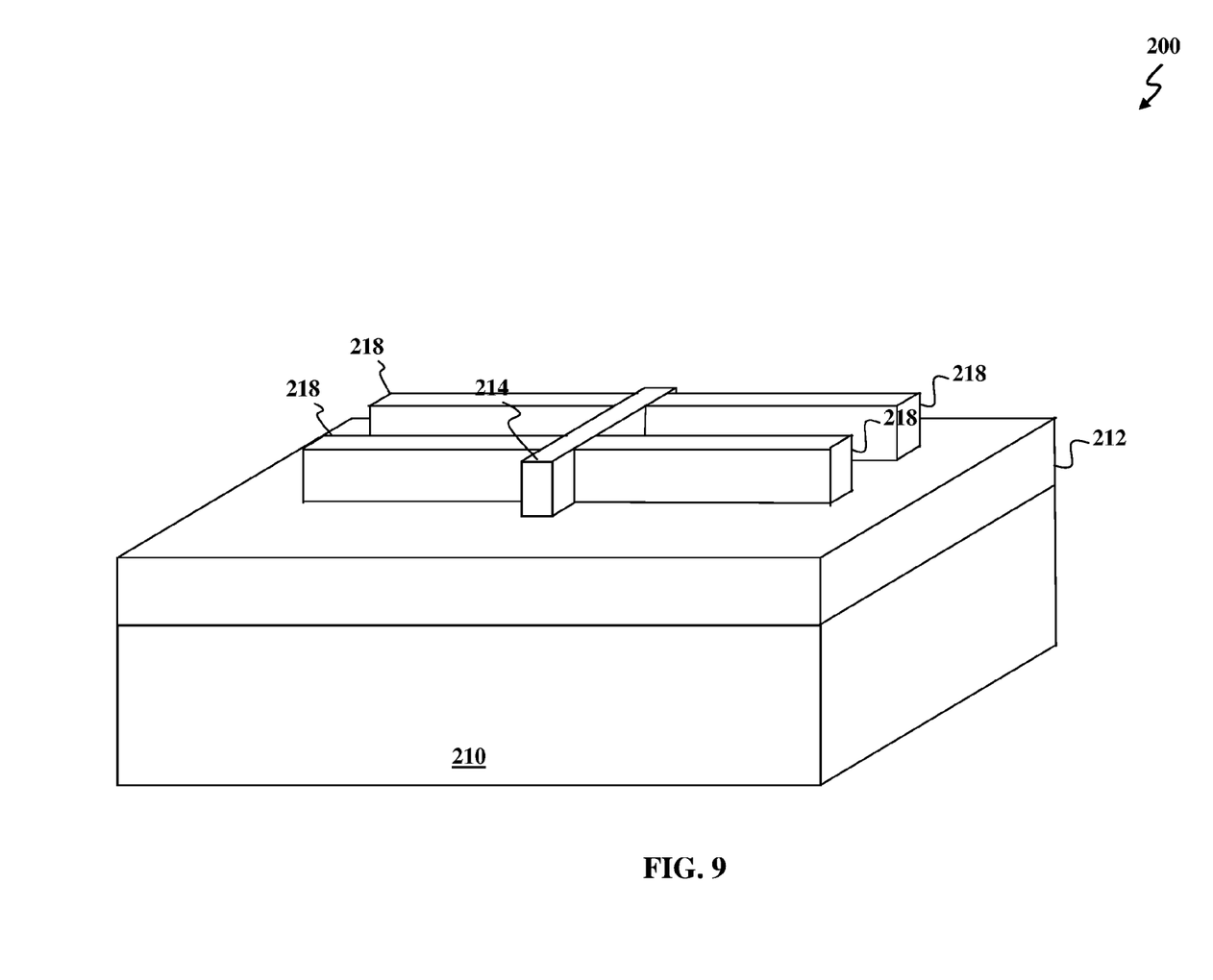

Referring to FIG. 9, after the etching process, the second photoresist layer 220 may be removed by any suitable process. For example, the second photoresist layer 220 may be removed by a liquid "resist stripper", which chemically alters the resist so that it no longer adheres to the underlying hardmask. Alternatively, second photoresist layer 220 may be removed by a plasma containing oxygen, which oxidizes it. As illustrated, the patterned sacrificial layer 214 separates (interposed) between end portions of two or more segments of the patterned hard mask layer 218—each segment defining a gate region.

Figure 10:
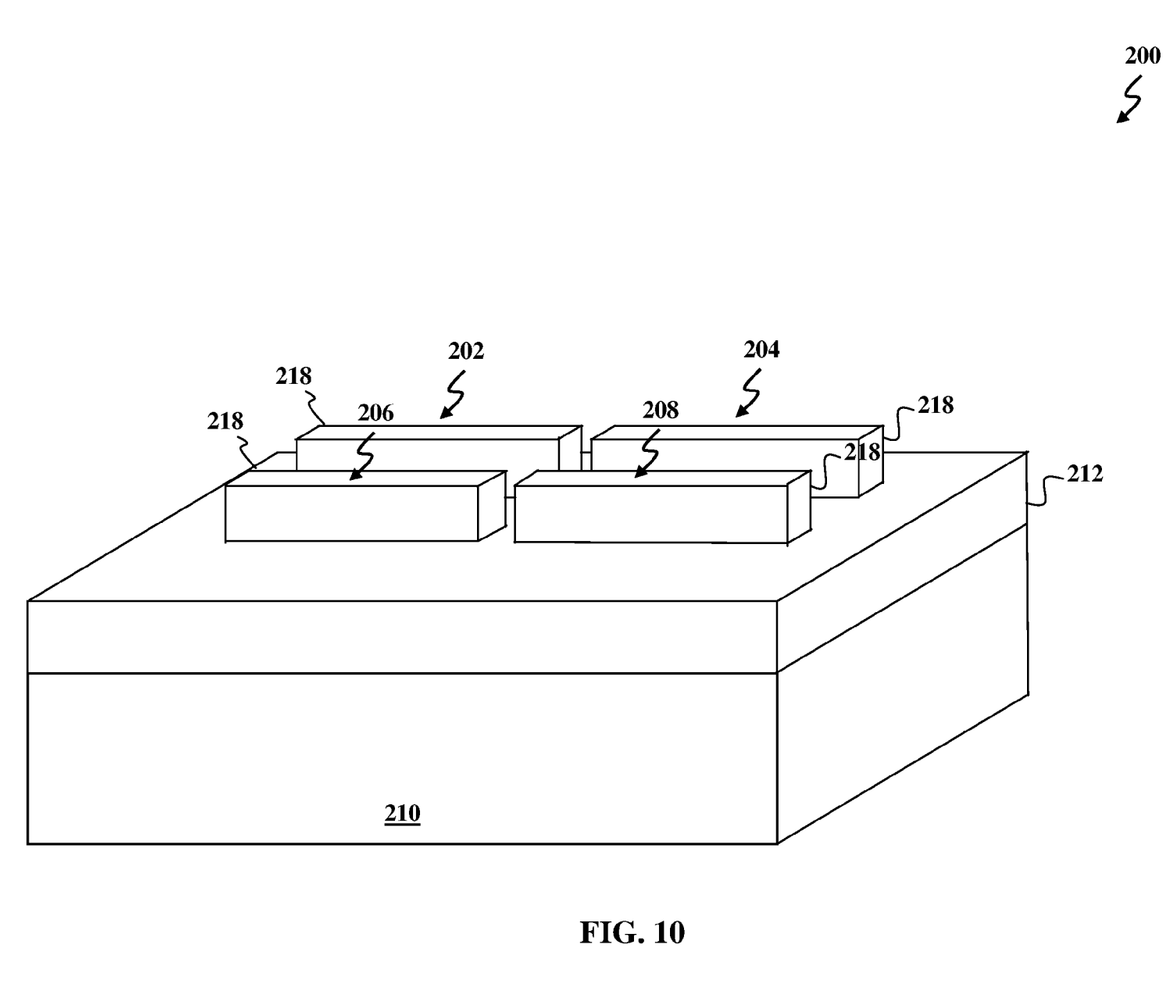

Referring to FIG. 10, the cut pattern of the patterned sacrificial layer 214 is selectively removed such that the plurality of gate stack patterns of the patterned hard mask layer 218 remain. As illustrated, the plurality of gate stack patterns of the hard mask layer 218 are separated by a gap after removing the cut patter of the patterned sacrificial layer 214. The gap is substantially equal to the width W2 of the sacrificial layer 214 (of FIG. 5). In the present embodiment, selectively removing the sacrificial layer 214 includes a wet etching process that includes diluted hydrogen fluoride. It is understood that where the sacrificial layer 214 is a different material the selective etching process may include a different etchant chemical. After the etching process, the hard mask layer 218 remains and defines two or more gate stack features. In the present embodiment, the patterned hard mask layer 218 defines four gate stack features (202, 204, 206, and 208).

Figure 11:
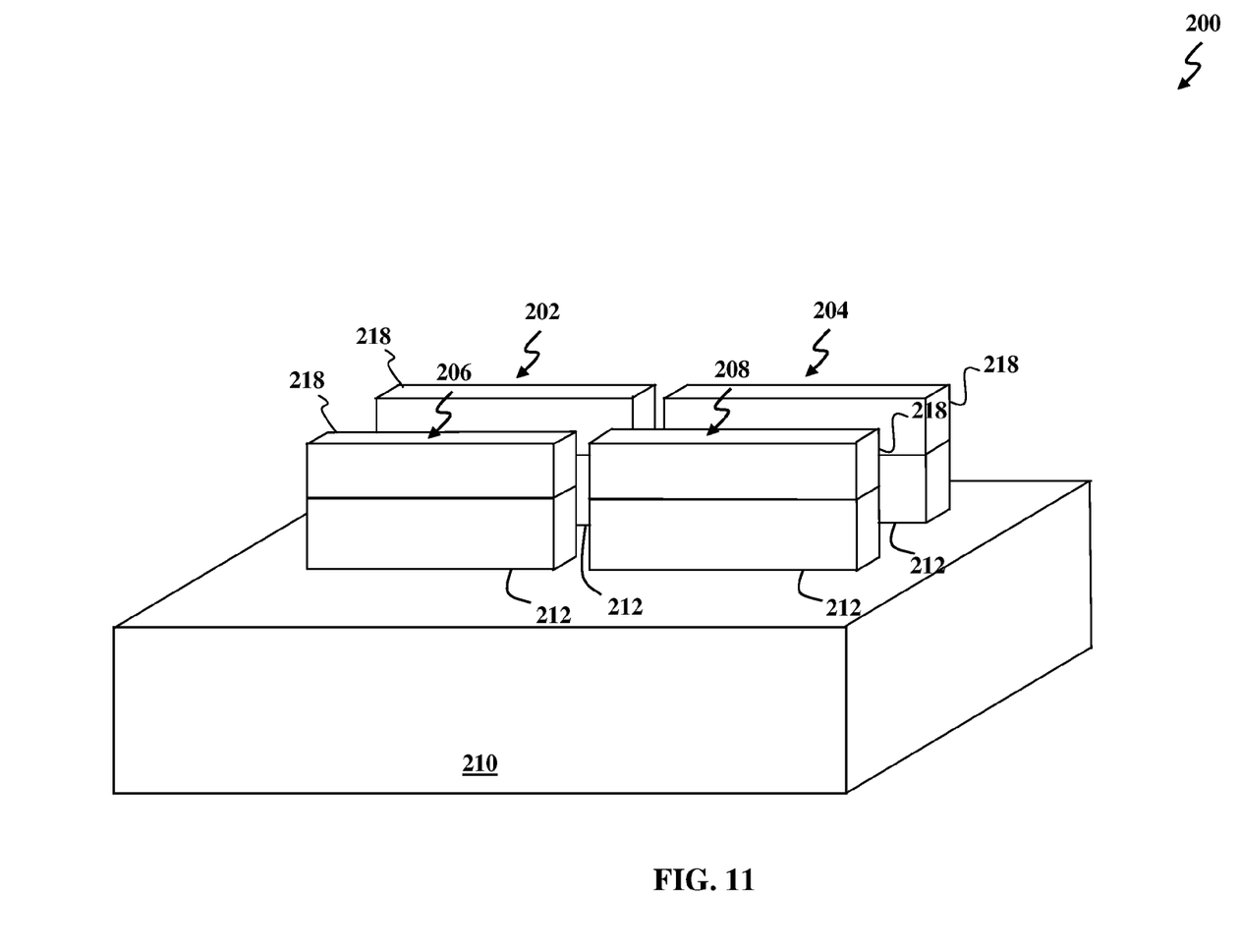

Referring to FIG. 11, the gate stack layer 212 is etched using the patterned hard mask layer 218. The etching process may be a single or a multiple step etching process. Further, the etching process may include wet etching, dry etching, or a combination thereof.

A benefit of the disclosed double patterning method, which uses the sacrificial layer, is that it allows for uniformly controlling the end-to-end critical dimensions (e.g., the dimension/gap between gate stack features 202 and 204, and the dimension/gap between gate stack features 206 and 208). Moreover, because the dimension/gap between the end portions of the gate stack features 202, 204, 206, and 208 is defined by the sacrificial layer (of FIGS. 2-9), smaller critical dimension requirements can be achieved when compare to other methods. Further, the profile of the gate stack features 202, 204, 206, and 208 is more vertical and square. An additional benefit is that the method of the disclosed embodiments can be easily implemented in the current manufacturing process. Thus, the disclosed embodiments provide for improved end-to-end critical dimensions uniformity control, for good line profile, and for allowing smaller critical dimensions requirements without adding significant cost to the manufacturing process and/or the device. It is understood that different embodiments may have different advantages, and that no particular advantage is necessarily required of any embodiment.

The semiconductor device 200 may undergo further processing to form various features. For example, the method 100 may proceed to form source and drain features, wall spacers, contact features (such as silicide regions), and other features. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 210 and a chemical mechanical polishing (CMP) process is further applied to the substrate to planarize the substrate. Further, a contact etch stop layer (CESL) may be formed on top of the gate structures before forming the ILD layer.

Subsequent processing may further form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

Thus, provided is a method of fabricating a semiconductor device. The exemplary method includes providing a substrate including a device layer and a sacrificial layer formed over the device layer. The method further includes patterning the sacrificial layer thereby defining a cut pattern. The cut pattern of the sacrificial layer has an initial width. The method further includes depositing a mask layer over the device layer and over the cut pattern of the sacrificial layer. The method further includes patterning the mask layer thereby defining a line pattern including first and second portions separated by the cut pattern of the sacrificial layer. The method further includes selectively removing the cut pattern of the sacrificial layer thereby forming a gap that separates the first and second portions of the line pattern of the mask layer. The method further includes patterning the device layer using the first and second portions of the line pattern of the mask layer.

In some embodiments, the method further includes after patterning the sacrificial layer and before depositing the mask layer, performing a critical dimension trim process thereby reducing the initial width of the cut pattern of the sacrificial layer to a final width.

In some embodiments, performing the critical dimension trip process includes a wet etching process. In certain embodiments, the final width is less than about 22 nm. In various embodiments, the device layer is a gate stack layer. In further embodiments, patterning the device layer includes forming a first gate stack feature and a second gate stack feature, the first and second gate stack features are separated by another gap having a dimension that is substantially the same as the final width of the cut pattern of the sacrificial layer. In some embodiments, patterning the sacrificial layer includes: depositing a photoresist layer over the sacrificial layer; patterning the photoresist layer; and using the patterned photoresist layer to pattern the sacrificial layer. In various embodiments, patterning the mask layer includes: depositing a photoresist layer over the mask layer; patterning the photoresist layer; and using the patterned photoresist layer to pattern the mask layer. In certain embodiments, the sacrificial layer includes a first type of dielectric material, the mask layer includes a second type of dielectric material, and the first and second type of dielectric materials are different.

Also provided is an alternative embodiment of a method. The exemplary method includes providing a substrate including a gate stack layer and a sacrificial layer formed over the gate stack layer. The method further includes patterning the sacrificial layer thereby defining a cut pattern, the cut pattern of the sacrificial layer having an initial width. The method further includes depositing a hard mask layer over the gate stack layer and over the cut pattern of the sacrificial layer. The method further includes patterning the hard mask layer thereby defining a plurality of gate stack patterns. The method further includes selectively removing the cut pattern of the sacrificial layer thereby forming a separation between each of the plurality of gate stack patterns of the hard mask layer. The method further includes patterning the gate stack layer using the plurality of gate stack patterns of the hard mask layer thereby defining a plurality of gate stack features.

In some embodiments, the method further includes after patterning the sacrificial layer and before depositing the hard mask layer, performing a critical dimension trim process thereby reducing the initial width of the cut pattern of the sacrificial layer to a final width. In various embodiments, the method further includes after depositing the hard mask layer and before patterning the hard mask layer, performing a chemical mechanical polishing (CMP) process to remove excess material of the hard mask layer thereby uncovering a top surface of the cut pattern of the sacrificial layer.

In some embodiments, depositing the hard mask layer includes depositing the hard mask layer such that a top surface of the cut pattern of the sacrificial layer remains uncovered. In certain embodiments, the sacrificial layer includes a first type of dielectric material, the hard mask layer includes a second type of dielectric material, and the first and second type of dielectric materials are different.

Also provided is another a method of fabricating a semiconductor device. The exemplary method includes providing a substrate, forming a gate stack layer over the substrate, forming a sacrificial layer over the gate stack layer, and forming a first patterned photoresist layer over the sacrificial layer. The method further includes patterning the sacrificial layer using the first patterned photoresist layer. The method further includes depositing a hard mask layer over the patterned sacrificial layer. The method further includes forming a second patterned photoresist layer over the hard mask layer and over the sacrificial layer. The method further includes patterning the hard mask layer using the second patterned photoresist layer thereby defining a plurality of gate stack patterns, wherein end portions of the plurality of gate stack patterns are separated by the patterned sacrificial layer. The method further includes selectively etching the patterned sacrificial layer thereby forming a gap that separates the end portions of the plurality of gate stack patterns. The method further includes patterning the gate stack layer using the plurality of gate stack patterns thereby defining a plurality of gate stack features.

In some embodiments, the method further includes after patterning the sacrificial layer and before depositing the hard mask layer, performing a critical dimension trim process on the patterned sacrificial layer. In various embodiments, the method further includes after depositing the hard mask layer and before forming a second patterned photoresist layer, performing a chemical mechanical polishing (CMP) process to remove excess material of the hard mask layer thereby uncovering a top surface of the patterned sacrificial layer.

In some embodiments, depositing the hard mask layer includes depositing the hard mask layer such that a top surface of the patterned sacrificial layer remains uncovered. In various embodiments, the gap is less then about 22 nm wide. In certain embodiments, the sacrificial layer includes a first type of dielectric material, the hard mask layer includes a second type of dielectric material, and the first and second type of dielectric materials are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a device layer over a substrate and a sacrificial layer over the device layer;

patterning the sacrificial layer thereby defining a cut pattern, the cut pattern of the sacrificial layer having an initial width;

depositing a mask layer over the device layer and over the cut pattern of the sacrificial layer, the mask layer and the cut pattern of the sacrificial layer having at least a top surface in the same plane;

patterning the mask layer thereby defining a pattern including first and second portions interposed by the cut pattern of the sacrificial layer;

removing the cut pattern of the sacrificial layer thereby forming a gap that separates the first and second portions of the pattern of the mask layer; and patterning the device layer using the first and second portions of the pattern of the mask layer.

2. The method of claim 1 further comprising:
after patterning the sacrificial layer and before depositing the mask layer, performing a critical dimension trim process thereby reducing the initial width of the cut pattern of the sacrificial layer to a final width.

3. The method of claim 2 wherein performing the critical dimension trim process includes a wet etching process.

4. The method of claim 3 wherein the final width is less than about 22 nm.

5. The method of claim 2 wherein the device layer is a gate stack layer.

6. The method of claim 5 wherein patterning the device layer includes forming a first gate stack feature and a second gate stack feature,
wherein the first and second gate stack features are separated by another gap having a dimension that is substantially the same as the final width of the cut pattern of the sacrificial layer.

7. The method of claim 1 wherein patterning the sacrificial layer includes:
depositing a photoresist layer over the sacrificial layer;
patterning the photoresist layer; and
using the patterned photoresist layer to pattern the sacrificial layer.

8. The method of claim 1 wherein patterning the mask layer includes:
depositing a photoresist layer over the mask layer;
patterning the photoresist layer; and
using the patterned photoresist layer to pattern the mask layer.

9. The method of claim 1 wherein the sacrificial layer includes a first type of dielectric material,
wherein the mask layer includes a second type of dielectric material, and
wherein the first and second type of dielectric materials are different.

10. A method of forming a semiconductor device, comprising:
forming a device layer over a substrate;
forming sacrificial layer over the device layer;
patterning the sacrificial layer thereby defining a cut pattern, the cut pattern of the sacrificial layer having an initial width defined from a first sidewall and an opposing second sidewall;
depositing a mask layer over the device layer and bounding the first and second sidewalls of the cut pattern of the sacrificial layer;
patterning the mask layer thereby defining a plurality of device patterns, wherein end portions of the plurality of device patterns of the mask layer are separated by the cut pattern of the sacrificial layer;
removing the cut pattern of the sacrificial layer thereby forming a separation between each of the plurality of device patterns of the mask layer; and
patterning the device layer using the plurality of device patterns of the mask layer thereby defining a plurality of device features.

11. The method of claim 10 further comprising:
after patterning the sacrificial layer and before depositing the mask layer, performing a critical dimension trim process thereby reducing the initial width of the cut pattern of the sacrificial layer to a final width.

12. The method of claim 10 further comprising:
after depositing the mask layer and before patterning the mask layer, performing a chemical mechanical polishing (CMP) process to remove excess material of the mask layer thereby uncovering a top surface of the cut pattern of the sacrificial layer.

13. The method of claim 10 wherein depositing the mask layer includes depositing the mask layer such that a top surface of the cut pattern of the sacrificial layer remains uncovered.

14. The method of claim 10 wherein the sacrificial layer includes a first type of dielectric material,
wherein the mask layer includes a second type of dielectric material, and
wherein the first and second type of dielectric materials are different.

15. A method of forming a semiconductor device, comprising:
providing a substrate;
forming a gate stack layer over the substrate;
forming a sacrificial layer over the gate stack layer;
forming a first patterned photoresist layer over the sacrificial layer;
patterning the sacrificial layer using the first patterned photoresist layer;
depositing a hard mask layer over the patterned sacrificial layer;
forming a second patterned photoresist layer over the hard mask layer and over the sacrificial layer;
patterning the hard mask layer using the second patterned photoresist layer thereby defining a plurality of gate stack patterns, wherein end portions of the plurality of gate stack patterns are separated by the patterned sacrificial layer;
selectively etching the patterned sacrificial layer thereby forming a gap that separates the end portions of the plurality of gate stack patterns; and
patterning the gate stack layer using the plurality of gate stack patterns thereby defining a plurality of gate stack features.

16. The method of claim 15 further comprising:
after patterning the sacrificial layer and before depositing the hard mask layer, performing a critical dimension trim process on the patterned sacrificial layer.

17. The method of claim 15 further comprising:
after depositing the hard mask layer and before forming a second patterned photoresist layer, performing a chemical mechanical polishing (CMP) process to remove excess material of the hard mask layer thereby uncovering a top surface of the patterned sacrificial layer.

18. The method of claim 15 wherein depositing the hard mask layer includes depositing the hard mask layer such that a top surface of the patterned sacrificial layer remains uncovered.

19. The method of claim 15 wherein the gap is less then about 22 nm wide.

20. The method of claim 15 wherein the sacrificial layer includes a first type of dielectric material, wherein the hard mask layer includes a second type of dielectric material, and wherein the first and second type of dielectric materials are different.

* * * * *